US012670955B2

(12) United States Patent
Li et al.

(10) Patent No.: US 12,670,955 B2
(45) Date of Patent: Jun. 30, 2026

(54) ANALOG CONTENT ADDRESSABLE MEMORY CELL AND ARRAY FOR SOFT DECISION BOUNDARIES AND SOFT DECISION TREE COMPUTATION SYSTEM USING THE SAME

(71) Applicant: The University of Hong Kong, Hong Kong (HK)

(72) Inventors: Can Li, Hong Kong (HK); Bo Wen, Hong Kong (HK); Guoyun Gao, Hong Kong (HK); Ruibin Mao, Hong Kong (HK)

(73) Assignee: The University of Hong Kong, Hong Kong (HK)

( * ) Notice: Subject to any disclaimer, the term of this patent is extended or adjusted under 35 U.S.C. 154(b) by 83 days.

(21) Appl. No.: 18/733,849

(22) Filed: Jun. 5, 2024

(65) Prior Publication Data

US 2024/0412786 A1 Dec. 12, 2024

Related U.S. Application Data

(60) Provisional application No. 63/507,105, filed on Jun. 9, 2023.

(51) Int. Cl.
| | |
|---|---|
| *G11C 15/04* | (2006.01) |
| *G06N 7/02* | (2006.01) |
| *G11C 27/00* | (2006.01) |

(52) U.S. Cl.
CPC ............. *G11C 15/046* (2013.01); *G06N 7/02* (2013.01); *G11C 27/005* (2013.01)

(58) Field of Classification Search
None
See application file for complete search history.

(56) References Cited

U.S. PATENT DOCUMENTS

| | | |
|---|---|---|
| 10,847,238 B2 | 11/2020 | Li et al. |
| 10,998,047 B1 | 5/2021 | Li et al. |
| | (Continued) | |

FOREIGN PATENT DOCUMENTS

| | | |
|---|---|---|
| CN | 114496038 A | 5/2022 |

OTHER PUBLICATIONS

L. Floridi, "Establishing the rules for building trustworthy AI," Nat. Mach. Intell., 2019, 1, 261-262.

(Continued)

*Primary Examiner* — Alfredo Bermudez Lozada
(74) *Attorney, Agent, or Firm* — IDEA Intellectual Limited; Sam T. Yip

(57) ABSTRACT

A SDT computation system is provided. The SDT computation system includes a SDT module, an ACAM array, and a mapping module. The SDT module is for outputting a final probability and configured to provide a SDT structure with a root node and deeper inner nodes for calculating probability, in which the final probability of each leaf node of the SDT structure is a product of all of node probabilities along a path from the root node to each leaf node, and wherein a final output of the SDT module is from a leaf with the highest probability. The mapping module is configured to map the SDT structure into the ACAM array, such that each of the ACAM cells in the ACAM array has a threshold programmed to be a parameter for a node in a path leading towards the leaf node of the SDT structure.

19 Claims, 14 Drawing Sheets

(56) References Cited

U.S. PATENT DOCUMENTS

| | | |
|---|---|---|
| 11,615,827 B2 | 3/2023 | Graves et al. |
| 2022/0108748 A1 | 4/2022 | Tseng et al. |
| 2022/0122646 A1* | 4/2022 | Graves ................. G11C 15/046 |
| 2022/0375526 A1* | 11/2022 | Tseng ..................... G11C 16/26 |

OTHER PUBLICATIONS

L. Grinsztajn, E. Oyallon and G. Varoquaux, "Why do tree-based models still outperform deep learning on tabular data?" arXiv preprint, 2022, arXiv:cs.LG/2207.08815v1.

C. Li et al., "Analog content-addressable memories with memristors," Nat. Commun., 2020, 11, 1638.

G. Pedretti et al., "Tree-based machine learning performed in-memory with memristive analog CAM," Nat. Commun., 2021, 12, 5806.

J. Bazzi, J. Sweidan, M. E. Fouda, R. Kanj and A. M. Eltawil, "Efficient Analog CAM Design," arXiv preprint, 2022, arXiv:cs. AR/2203.02500v1.

X. Yin et al., "FeCAM: A Universal Compact Digital and Analog Content Addressable Memory Using Ferroelectric," IEEE Transactions on Electron Devices, 2020, 67, 2785-2792.

X. Yin et al., "Deep random forest with ferroelectric analog content addressable memory," arXiv preprint, 2021, Xiv:cs. ET/2110. 02495v1.

L. Danial et al., "Two-terminal floating-gate transistors with a low-power memristive operation mode for analogue neuromorphic computing," Nat. Electron., 2019, 2, 596-605.

A. Kazemi et al., "A flash-based multi-bit content-addressable memory with euclidean squared distance," 2021 IEEE/ACM International Symposium on Low Power Electronics and Design (ISLPED), 2021, 1-6.

G. C. Adam, A. Khiat and T. Prodromakis, "Challenges hindering memristive neuromorphic hardware from going mainstream," Nat. Commun., 2018, 9, 5267.

N. Frosst and G. Hinton, "Distilling a neural network into a soft decision tree," arXiv preprint, 2017, arXiv:cs. LG/1711.09784.

O. Irsoy, O. T. Yldz and E. Alpaydn, "Soft decision trees," In Proceedings of the 21st International Conference on Pattern Recognition (ICPR2012), 2012, 1819-1822.

C. Olaru and L. Wehenkel, "A complete fuzzy decision tree technique," Fuzzy Sets and Systems, 2003, 138, 221-254.

K. Ito, M. Ogawa and T. Shibata, "A high-performance ramp-voltage-scan winner-take-all circuit in an open loop architecture," Jpn. J. Appl. Phys., 2002, 41, 2301-2305.

E. Rahiminejad, M. Saberi, R. Lotfi, M. Taherzadeh-Sani and F. Nabki, "A low-voltage high-precision time-domain winner-take-all circuit," IEEE Transactions on Circuits and Systems II: Express Briefs, 2019, 67, 4-8.

* cited by examiner

100

400

ANALOG CONTENT ADDRESSABLE MEMORY CELL AND ARRAY FOR SOFT DECISION BOUNDARIES AND SOFT DECISION TREE COMPUTATION SYSTEM USING THE SAME

CROSS-REFERENCE TO RELATED APPLICATIONS

The present application claims priority from U.S. provisional patent application Ser. No. 63/507,105 filed Jun. 9, 2023, and the disclosures of which are incorporated by reference in their entireties.

TECHNICAL FIELD

The present invention generally relates to tree-based machine learning. More specifically, the present invention relates to methods and apparatuses for trustworthy tree-based machine learning in analog content addressable memory (CAM) with soft decision boundaries.

BACKGROUND

Artificial intelligence (AI) is transforming society, with growing concern about the trustworthiness of AI, particularly in high-risk areas such as healthcare, transportation, and law. Building trustworthy AI models requires two key technical elements: interpretability and robustness. Understanding why a model makes a particular prediction, or how even a small change in input significantly impacts the model's performance, is essential for establishing trust. Unfortunately, popular AI models like deep neural networks are often considered "black boxes," making them difficult to explain. Moreover, they are frequently unstable for inputs with minor differences that are imperceptible to humans. This lack of interpretability and robustness undermines the trustworthiness of AI models.

Tree-based models, such as Random Forest and Gradient Boost Trees, are popular machine learning approaches due to their explainability and high accuracy on tabular data. However, the inference latency of tree-based models can become a bottleneck, especially for models with more trees and larger depth. While efforts have been made to accelerate tree-based models on GPU, recent advances in non-volatile memory (NVM) devices have opened up new possibilities for novel computing approaches beyond traditional von Neumann architectures, particularly for computationally intensive AI models. Analog content addressable memory (CAM) designs have shown great potential for parallelly accelerating inference for tree-based models in memory. In these designs, each decision path is mapped to a corresponding row in the analog CAM array. Most of the designs are based on memristors and ferroelectric field effect transistors (FeFET), which have demonstrated orders of magnitude improvement over conventional digital approaches. Additionally, flash-based memory is being explored for its potential in analog CAM implementation, thanks to advancements in fast and high-precision tuning of memory storage, as well as improvements in energy cost and endurance during analog operation.

Tree-based models can also be binarized and implemented in binary CAM and ternary CAM (TCAM). However, emerging NVM devices often suffer from non-ideal properties such as device variation and drifting noise. Unfortunately, tree-based models are highly sensitive to noise around decision boundaries. Even minor distortions, such as adversarial attacks on inputs or drifting weights in NVM devices, can lead to drastically different outcomes. To address these issues, analog CAM designs with soft boundaries have been proposed. These designs can significantly alleviate the sensitivity of tree-based models to noise, making them more robust and reliable.

The matching boundaries in analog CAM are not ideal, unlike the orthogonal boundaries in decision trees, but are similar to the curves of sigmoid functions. Additional design, such as sensor amplifier circuits, is typically required to make the boundaries steep enough for matching. Interestingly, the sigmoid function can serve as the gating or activation function in soft decision trees (SDTs). Unlike most decision trees with orthogonal decision boundaries, SDTs have a sigmoid-like boundary for each node, and each path node denotes a partial probability for the final result, which is also expressed as a probability. This provides human users with an idea of how much confidence the model has in its prediction. As a result, SDTs can fit smoother around split points with lower bias, stronger robustness, and better interpretability. However, the improvement of SDTs inevitably leads to extremely expensive calculation overhead in conventional digital hardware based on von-Neumann architecture. This is because it needs to go through every path to calculate the probabilities through numerous multiplications and sigmoid activations during inference.

Therefore, there is a need for improving analog CAM solutions to develop a simple mapping configuration with high stronger robustness and better interpretability.

SUMMARY OF INVENTION

It is an objective of the present invention to provide methods and apparatuses to address the aforementioned shortcomings and unmet needs in the state of the art.

In this regard, tree-based machine learning models are more trustworthy because they maintain reasonable interpretability and inspectability. Those models, however, are highly sensitive to adversarial attacks around decision boundaries. Soft decision boundaries can potentially mitigate the problem but are extremely inefficient in conventional digital hardware.

As observing this and the similarity between the decision boundaries in SDTs and matching boundaries in analog CAM (ACAM), the proposed solution in the present invention is an algorithm-hardware co-design of hardware-aware SDTs that can soften a decision tree into analog CAM with improved accuracy, robustness, and interpretability, thereby enhancing trustworthiness. The proposed design of the present invention can leverage the non-idealities in emerging NVM devices and further explore the potential of analog CAM.

The present disclosure is related to connection of the softness in decision/matching boundaries between tree-based models and analog CAM. By leveraging the non-idealities in emerging devices, analog CAM can naturally implement a SDT model and accelerate inference. In this case, the previous design of sensor amplifiers that were used to sharpen the boundary can be removed, thereby saving area and energy.

To further improve the accuracy and trustworthiness, the proposed algorithm-hardware co-design of hardware-aware SDT can soften a decision tree into analog CAM through knowledge distilling. This approach does not require any additional hardware overhead, as it leverages the potential of the hardware. The softened decision tree can achieve better performance with improved robustness against the threat of adversarial attacks in input data, even at root nodes (e.g., with only a 1.7% drop in accuracy compared to a 14.4% drop for traditional decision trees).

The proposed design also demonstrates impressive robustness against drifting noise in hardware. In the hand-written digits recognition task, the average accuracy of a standard decision tree drops suddenly from 88.8% to 43.5% when it suffers from hardware-caused threshold drifting. In contrast, the proposed SDT model can still maintain an accuracy over 90% with only a minor decrease of 0.6%. This highlights the potential of the proposed hardware-aware SDT design to improve the robustness and reliability of tree-based models in the presence of hardware non-ideali-ties.

Briefly, the proposed and demonstrated solution in the present invention is that analog CAM can naturally imple-ment tree-based models with soft boundaries and achieve better MNIST accuracy (91.3% vs. 88.3%) than models with hard boundaries. More importantly, it shows significantly improved robustness against adversarial attacks (1.7% vs. 14.4% drop in accuracy) and device non-idealities (0.6% vs. 45.3% drop in accuracy).

In accordance with the first aspect of the present inven-tion, an ACAM cell for mapping a well-trained SDT into an analog CAM configuration is provided. The ACAM cell includes a first floating-gate transistor (FG-FET) and a second FG-FET, a match line, a source coupled line, a first search line, and a second search line. The match line is electrically coupled to drains of the first and second FG-FETs. The source coupled line is electrically coupled to sources of the first and second FG-FETs. The first search line is electrically coupled to a gate of the first FG-FET. The second search line is electrically coupled to a gate of the second FG-FET. The first and second FG-FETs are collec-tively configured to serve for a dynamic process which is started with pre-charging the match line to a high-level voltage and then applying a voltage to the first search line or the second search line to increase electrical potential of the corresponding gate of the first FG-FET or the second FG-FET, such that the match line discharges to the source coupled line, resulting in a reduction in a match-line voltage, permitting the match-line voltage to decrease for approach-ing to zero within a matching range of a search-line voltage.

In accordance with the second aspect of the present invention, an ACAM array for mapping a well-trained SDT into an analog CAM configuration is provided. The ACAM array includes an input controller, an output receiver, and a plurality of ACAM cells electrically coupled between the input controller and the output receiver. The ACAM cells are arranged as multiple rows and multiple columns. The ACAM cells in the same row share a voltage from the same match line. The first search lines and the second search lines are electrically connected to the input controller, and the match lines are electrically connected to the output receiver, such that the ACAM cells are configured to map signals from the input controller and output match-line voltages to the output receiver in response to a mapping result during the dynamic process.

In accordance with the third aspect of the present inven-tion, a SDT computation system is provided. The SDT computation system includes a SDT module, an ACAM array, and a mapping module. The SDT module is for outputting a final probability and configured to provide a SDT structure with a root node and deeper inner nodes for calculating probability, in which the final probability of each leaf node of the SDT structure is a product of all of node probabilities along a path from the root node to each leaf node, and wherein a final output of the SDT module is from a leaf with the highest probability. The mapping module is configured to map the SDT structure into the ACAM array, such that each of the ACAM cells in the ACAM array has a threshold programmed to be a parameter for a node in a path leading towards the leaf node of the SDT structure.

BRIEF DESCRIPTION OF DRAWINGS

Embodiments of the invention are described in more details hereinafter with reference to the drawings, in which.

DETAILED DESCRIPTION OF THE INVENTION

Figure 1B:
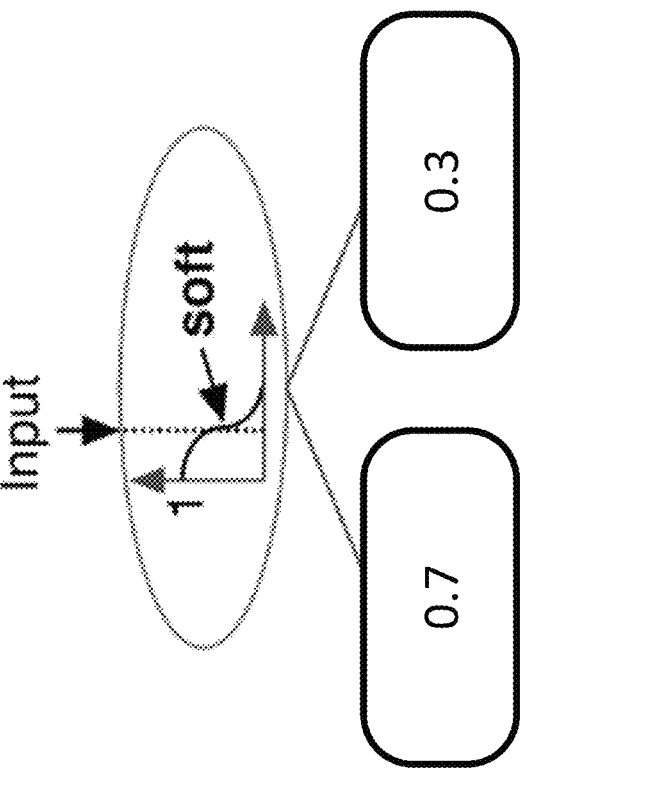
FIG. 1B shows a soft decision tree of the present disclo-sure with only one node and two leaves.

In the following description, apparatuses, systems, and/or methods for trustworthy tree-based machine learning in content addressable memory (ACAM) with soft decision boundaries and the likes are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Softness in Trees and ACAM Arrays:

Some related works proposed soft decision tree (SDT) as a new method of fuzzy decision tree. A unique feature of SDT is the inclusion of an additional parameter called "width" with each threshold in the tree nodes, which allows the decision boundaries to turn from axis-orthogonal splits to oblique splits. This results in a much lower variance than standard trees, and thus performs better with high accuracy. One of related works further developed SDT by giving probabilities to both children of internal nodes using a sigmoid gating function. This allows for soft decisions to be made, and the final decision is a weighted average of all the leaves through all possible paths with different probabilities. The sigmoid function at each node is g(x):

$$g(x) = \sigma\left(w^T x + w_0\right) \qquad \text{(Eq. 1)}$$
$$= \frac{1}{1 + e^{-\left(w^T x + w_0\right)}}$$

where the parameter $w^T$ in the node is a vector that transfers the input vector x into another vector space. The model is trained using the gradient descent method, which can improve accuracy with fewer nodes. However, it adds a fully connected layer before the decision tree, which inevitably weakens interpretability. Some related works proposed a knowledge distilling method to use a trained neural network to create a soft decision tree with better generalization performance. The result depends on which leaf has a higher probability. Knowledge distilling can help improve the accuracy of soft decision trees by training it with soft labels that are a weighted average of the predictions of the neural network and the true labels. It is important to note that the inference latency of SDT models can be significantly higher than the counterpart of standard decision trees. On CPU, the latency can be hundreds of times higher, and on GPU, it can be dozens of times higher. Therefore, it is important to consider the application and the hardware constraints when choosing to use an SDT model.

Figure 1A:
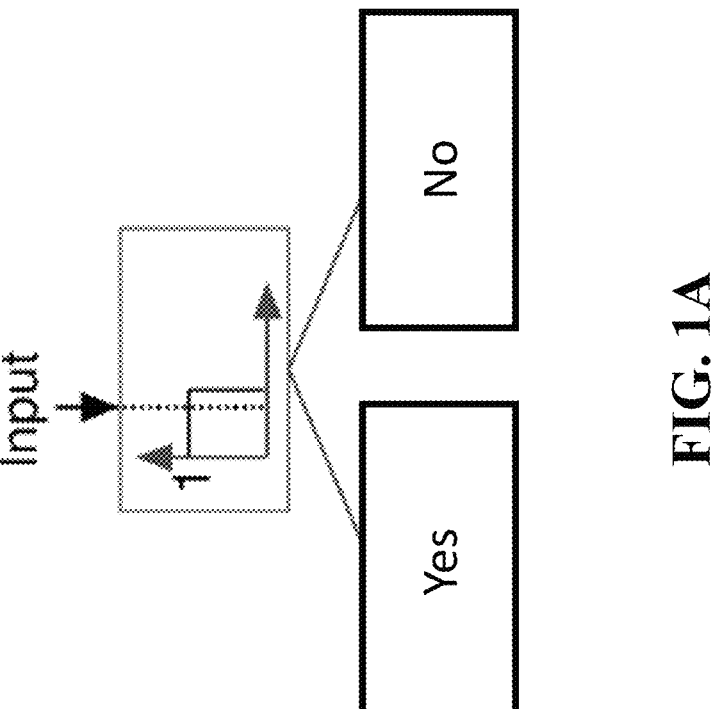
FIG. 1A shows a simple example of binary standard hard decision tree.

In the SDT configuration of the present disclosure, it aims to maintain the interpretability of the decision tree without adding a fully connected layer before the tree. To achieve this, knowledge distilling with soft labels in one of related works is used, which has no extra hardware overhead during inference. The sigmoid function is modified to change from nearly 0 to 1 in a short range. The sigmoid function is defined as f(x):

$$f(x) = \sigma(k(x - c)) \qquad \text{(Eq. 2)}$$
$$= \frac{1}{1 + e^{-k(x-c)}}$$

where the scalar k is a gain to control the softness of the sigmoid function, and c is the threshold value for f(x) crossing 0.5. For comparison, FIG. 1A shows a simple example of binary standard hard decision tree, and FIG. 1B shows SDT of the present disclosure with only one node and two leaves.

Figure 2A:
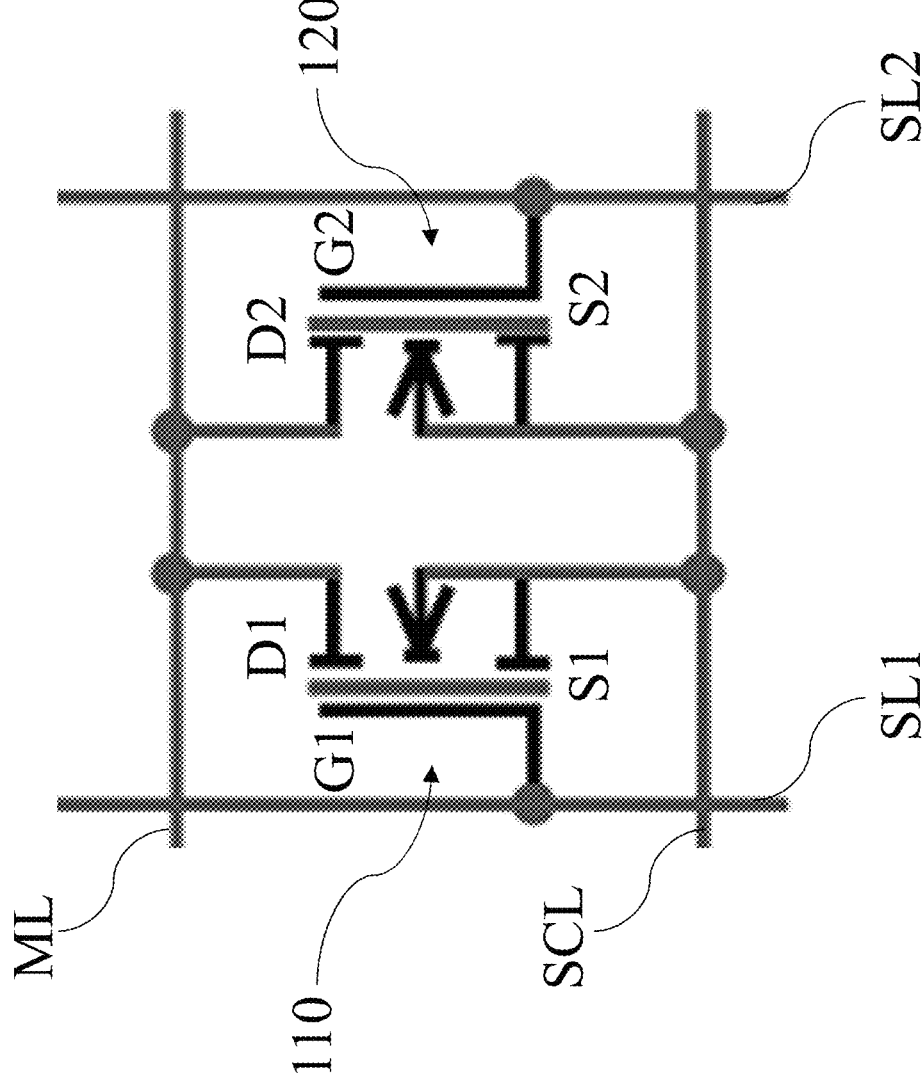
FIG. 2A depicts a schematic drawing for an analog content addressable memory (ACAM) cell based on floating gate field-effect transistor (FG-FET) flash according to one embodiment of the present invention.

FIG. 2A depicts a schematic drawing for an ACAM cell 100 based on floating gate field-effect transistor (FG-FET) flash according to one embodiment of the present invention. The ACAM cell 100 can serve as a unit for mapping a well-trained SDT into an analog CAM configuration. The ACAM cell 100 includes an FG-FET 110 and a second FG-FET 120, a match line ML, a source coupled line SCL, a first search line SL1, and a second search line SL2.

The match line ML is electrically coupled to drains D1, D2 of the first and second FG-FETs 110, 120. The source coupled line SCL is electrically coupled to sources S1, S2 of the first and second FG-FETs 110, 120. The first search line SL1 is electrically coupled to a gate G1 of the first FG-FET 110, and the second search line SL2 is electrically coupled to a gate G2 of the second FG-FET 120.

For mapping a well-trained SDT, the first and second FG-FETs 110, 120 are collectively configured to serve for a dynamic process (i.e., a matching operation) which is started with pre-charging the match line ML to a high-level voltage. In one embodiment, the first and second FG-FETs 110, 120 can adjust the high and low matching bounds with their threshold voltages to act as an inner node in the decision tree. Then, a voltage is applied to the first search line SL1 and/or the second search line SL2 to increase electrical potential of the corresponding gate G1 or G2 of the first FG-FET 110 or the second FG-FET 120, such that the match line ML discharges to the source coupled line SCL, resulting in a reduction in a match-line voltage, permitting the match-line voltage to decrease for approaching to zero within a matching range of a search-line voltage. In this regard, the match line ML voltage can remain high when a voltage of the corresponding search line SL1 or SL2 falls within the matching range, and drops to zero otherwise.

Sense amplifiers are typically used to sense a match-line voltage drop efficiently and to realize a sharp matching boundary. However, in the design of the present disclosure, as shown in FIG. 2A, the sense amplifier can be removed since a sharp final matching boundary is not required.

Figure 2B:
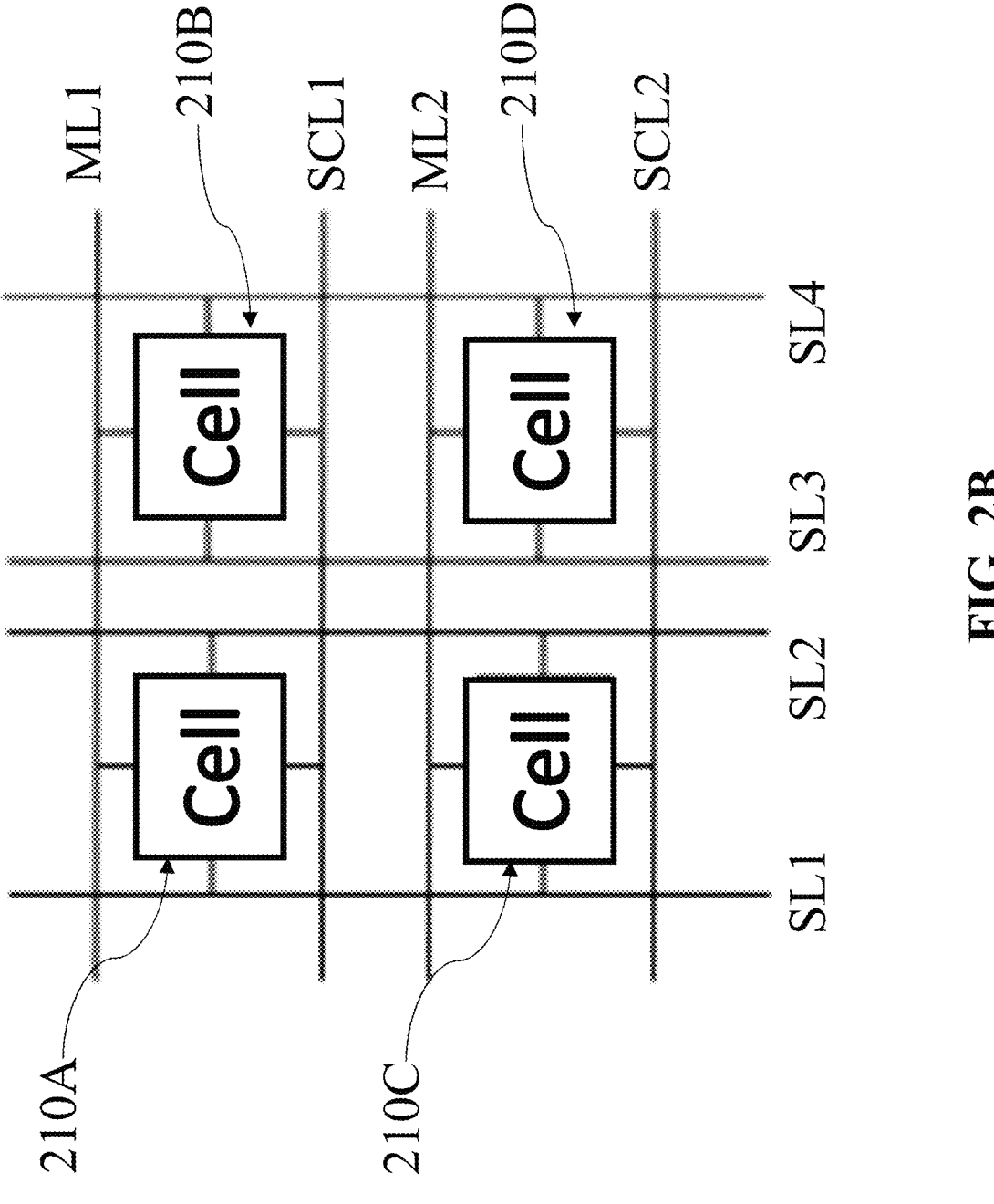
FIG. 2B depicts a schematic drawing for a 2×2 ACAM array using ACAM cells according to one embodiment of the present invention.

FIG. 2B depicts a schematic drawing for a 2×2 ACAM array 200 using ACAM cells according to one embodiment of the present invention. The illustration of FIG. 2B is an example of a corresponding ACAM array consisting of four ACAM cells 210A, 210B, 210C, 210D which have configurations identical with or similar with the ACAM cell 100. The ACAM cells 210A, 210B, 210C, 210D in the same columns or rows share the same search lines or match lines. For example, The ACAM cells 210A, 210B share the same match line ML1 and/or the same source coupled line SCL1; the ACAM cells 210C, 210D share the same match lines ML2 and/or the same source coupled line SCL2. The ACAM cells 210A, 210C share the same search lines SL1, SL2; the ACAM cells 210B, 210D share the same search lines SL3, SL4. In one embodiment, the spice model is experimentally calibrated by a cell with two floating-gate transistors.

Figure 2C:
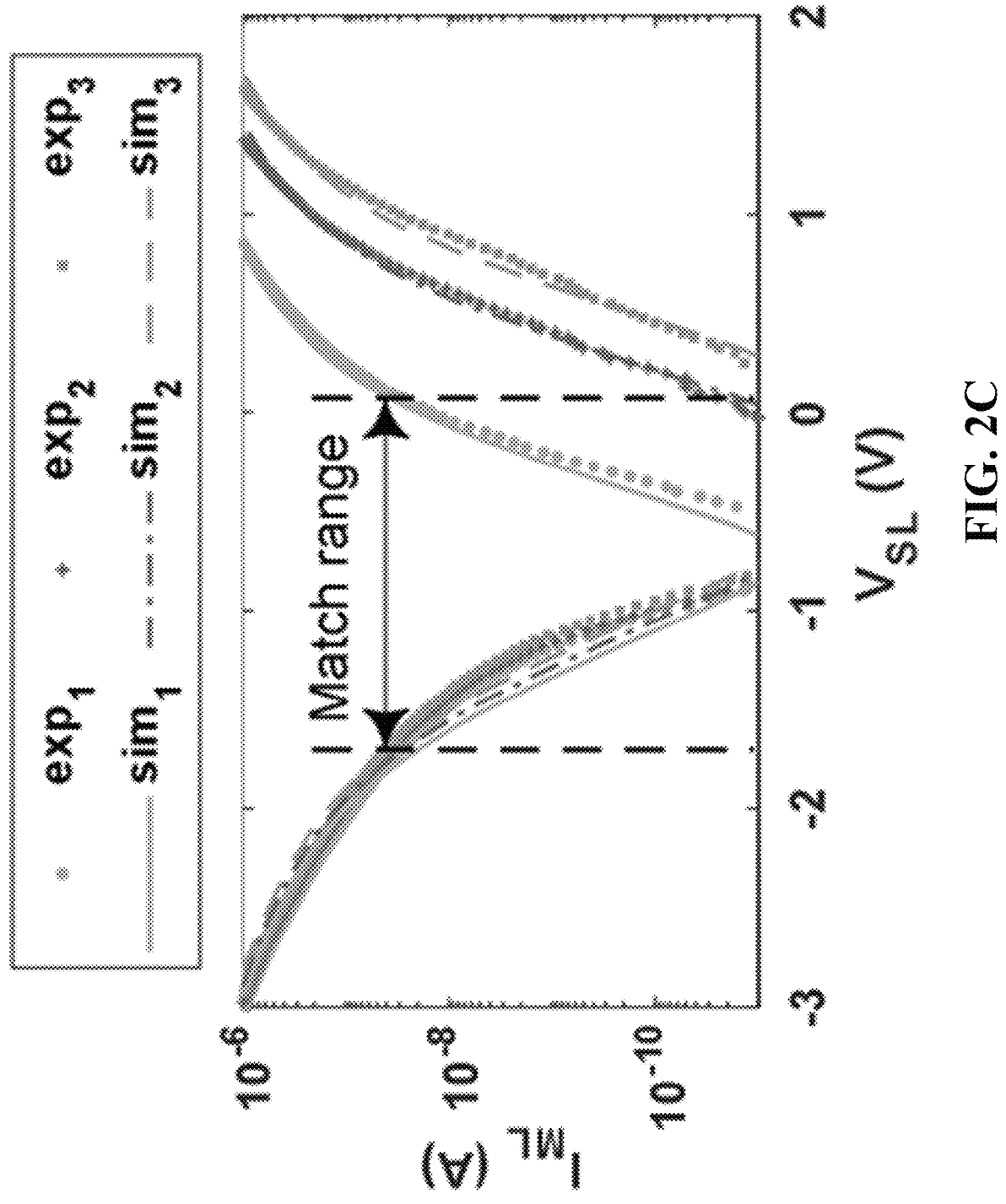
FIG. 2C depicts a graph for showing a matching range of an ACAM cell with experimental and simulation results according to one embodiment of the present invention.

Based on the spice simulation, FIG. 2C depicts a graph for showing a matching range of an ACAM cell with experimental and simulation results with the matching SL voltage range according to one embodiment of the present invention. A matching range of a search-line voltage is labelled as "Match range" in FIG. 2C. According to the illustration, the I-V curves of ACAM cells with different thresholds fit well with little difference.

Figure 3B:
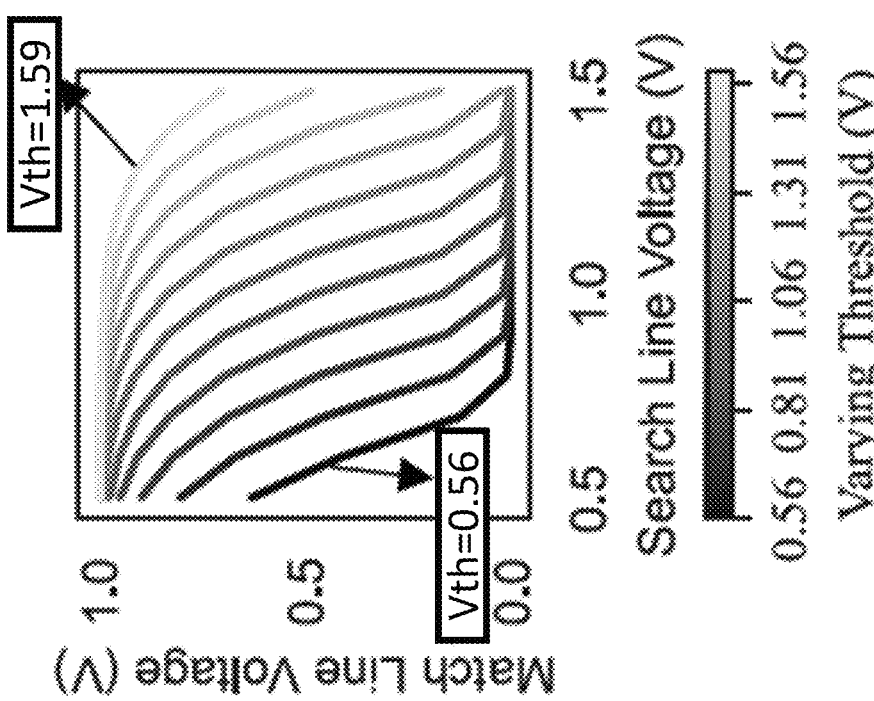
FIG. 3B depicts an exemplary graph for soft matching boundaries in an ACAM configuration according to one embodiment of the present invention.

In various embodiments, in the ACAM array, an FG-FET of the ACAM cells has a threshold voltage in a range from 0.56 V to 1.59 V. In this regard, FIG. 3A depicts an exemplary graph for modified sigmoid functions; and FIG. 3B depicts an exemplary graph for soft matching boundaries in an ACAM configuration according to one embodiment of the present invention.

Figure 3A:
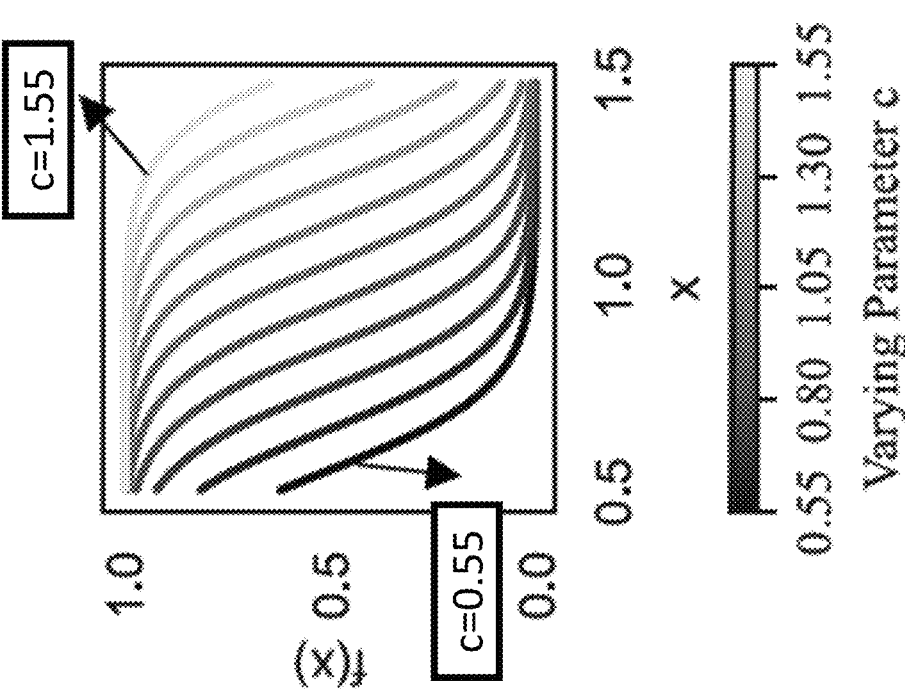
FIG. 3A depicts an exemplary graph for modified sigmoid functions.

Specifically, the illustration of FIG. 3A shows the modified sigmoid functions of f(x) where k equals to −10 and c varies from 0.55 to 1.55 in Eq. 2. The sign of k determines whether f(x) increases or decreases along the positive x-axis. The illustration of FIG. 3B displays the spice simulation results of the left transistor in a floating-gate flash cell shown in FIG. 2A, with thresholds varying from 0.56V to 1.59V. The matching boundary in this case is the change of the match line from high to low versus the search-line voltage. The soft boundaries are almost the same as the curves of the modified sigmoid functions in FIG. 3A.

To further analyze the properties of soft matching boundaries in the ACAM arrays, a set of equations is developed to describe the dynamic process of transistors in the ACAM cell during the matching process. At the beginning of the process, the match-line voltage (ML voltage) is pre-charged to a high-level voltage. Then, with the search-line voltages (SL voltage) applied to the gates of transistors, the match-line may discharge with different currents, causing a decrease in ML voltage. Since the ML voltage is the drain voltage $V_d$ of the transistors in cells, the reduced ML voltage can make the discharge current lower and depress the discharge process in a way of negative feedback. For a transistor in a cell (e.g., FG-FET in a cell), there are two cases for its current change. If the SL voltage, which is the gate voltage $V_g$, is smaller than the threshold voltage, which means $V_g < V_{th}$, then the transistor works at the subthreshold region, as shown by the equation:

$$I_{d,sub} = I_0 e^{\frac{q(V_g - V_{th})}{nKT}} \left(1 - e^{-\frac{qV_d}{KT}}\right)$$ (Eq. 3)

where $I_0$, q, n, K and T are all constants, and $(V_g - V_{th})$ does not change for a particular matching process. The $I_d$ will decrease to 0 with the decrease of $V_d$ to 0. When the SL voltage is higher than the threshold voltage, which means $V_g > V_{th}$ the transistor initially operates in the saturation region and then switches to the linear region as $V_d$ decreases. The equations for the current in these regions are:

$$I_{d,sat} = \frac{KP}{2} \frac{W}{L} (1 + \lambda V_d)(V_g - V_{th})^2$$ (Eq. 4)

$$I_{d,lin} = KP \frac{W}{L} (1 + \lambda V_d)\left(V_g - V_{th} - \frac{V_d}{2}\right)V_d$$ (Eq. 5)

where $$KP, \lambda, \frac{W}{L}$$

are constants associated with the processing process of transistors. Since the ML voltage is shared by the cells in a row with probably different thresholds and gating voltages (SL voltages), the actual process of match line dropping, dependent on the sum of each cell's charging current, can be much more complicated. Nevertheless, the sum of currents should be a mixture of the above equations of $I_d$ at different working regions. An approximate fitting of the matching boundaries is made based on the reference to them. The part of fitting and comparison is further described in the next section in detail. Therefore, the intrinsic soft matching boundaries can be used in ACAM to implement modified sigmoid functions as gating functions in SDT naturally.

Figure 4:
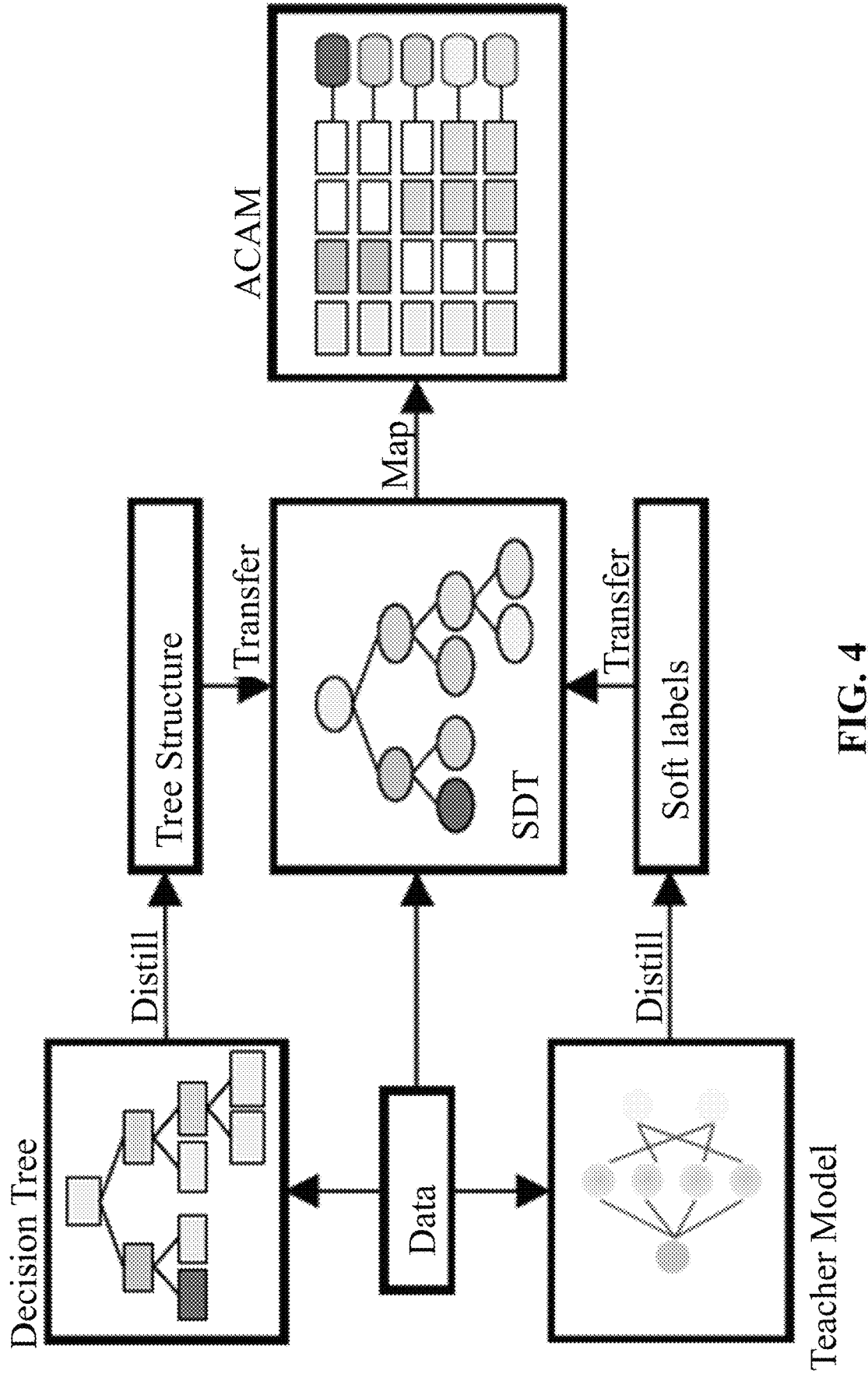
FIG. 4 depicts a flowchart of softening a decision tree into an ACAM configuration through knowledge distilling according to one embodiment of the present invention.

Softening Decision Trees into ACAM Arrays:

FIG. 4 depicts a flowchart of softening a decision tree into an ACAM configuration through knowledge distilling according to one embodiment of the present invention. Since widely used tools and libraries exist to build standard decision trees and forests, there is no need to train a soft one from scratch unless the methods are entirely different. Instead, modifications can be made based on widely accepted methods and improve performance, which can give the proposed design greater significance in application. This approach is also fairer when comparing robustness. The upper branch in FIG. 4 is to simply build a standard tree first and then distill the tree structure for SDT. Three parts are transferred into the SDT: feature selection for each node, every decision path of the tree, and the distribution in the leaf nodes. Since the standard tree has already been pruned, the structure after pruning is also transferred into the SDT. The lower branch in FIG. 4 of knowledge distilling is to provide soft labels for SDT. The soft labels used here are a composite of the predictions from the teacher model and true labels. They can make the data samples more distinguishable as strong, medium, or weak and provide more information to the student model. This approach can also be helpful for model regularization. If the teacher model gives a prediction for an input with a probability of P, and the ground truth for the input is G, which is either 0 or 1 (e.g., in one-hot labels), then the soft label S should be as follows:

$$S = \frac{P + \beta G}{\beta + 1}$$ (Eq. 6)

where $\beta$ is a tuning coefficient. The teacher model is generally a much larger and more complicated model with high accuracy for the dataset. It can be deep models or ensemble models. A random forest with 300 trees is chosen to be the teacher model here for its convenience to train and use. The tuning coefficient $\beta$ is set as 1, making it an arithmetic average.

For conventional designs, decision trees were usually built using greedy algorithms that calculated Gini impurity or Shannon information gain. This approach can lead to local minimum traps or heavy overfitting. Most conventional SDT models are trained after a fully-connected layer to find the feature combination automatically using gradient descent methods. This approach can also cause local minimum problems and affect the interpretability of the SDT.

In the approach of the present disclosure, both transferring the tree structure through knowledge distilling and then training the tree using gradient descent approaches with the soft labels are combined. The trainable parameters in the proposed SDT fall into three categories: gain $k_i$ and threshold $c_i$ in the $i_{th}$ inner node, as well as distribution $Q_j$ in the $j_{th}$ leaf node. For an SDT with m inner nodes and n leaf nodes, it follows that n=m+1. The number of parameters for $k_i$, $c_i$ and $Q_j$ should be m, m, and nT for a classification task with T classes. Considering the next step of mapping the well-trained SDT into ACAM, it is discovered that the thresholds $c_i$ in inner nodes are repeatedly mapped in different rows. Thus, these thresholds in nodes shared by many decision paths can have different thresholds with the same initial values to further release the potential of ACAM. This approach is equivalent to changing the binary SDT to a multi-way SDT with more powerful modeling ability and without hardware overhead in ACAM.

Figure 5A:
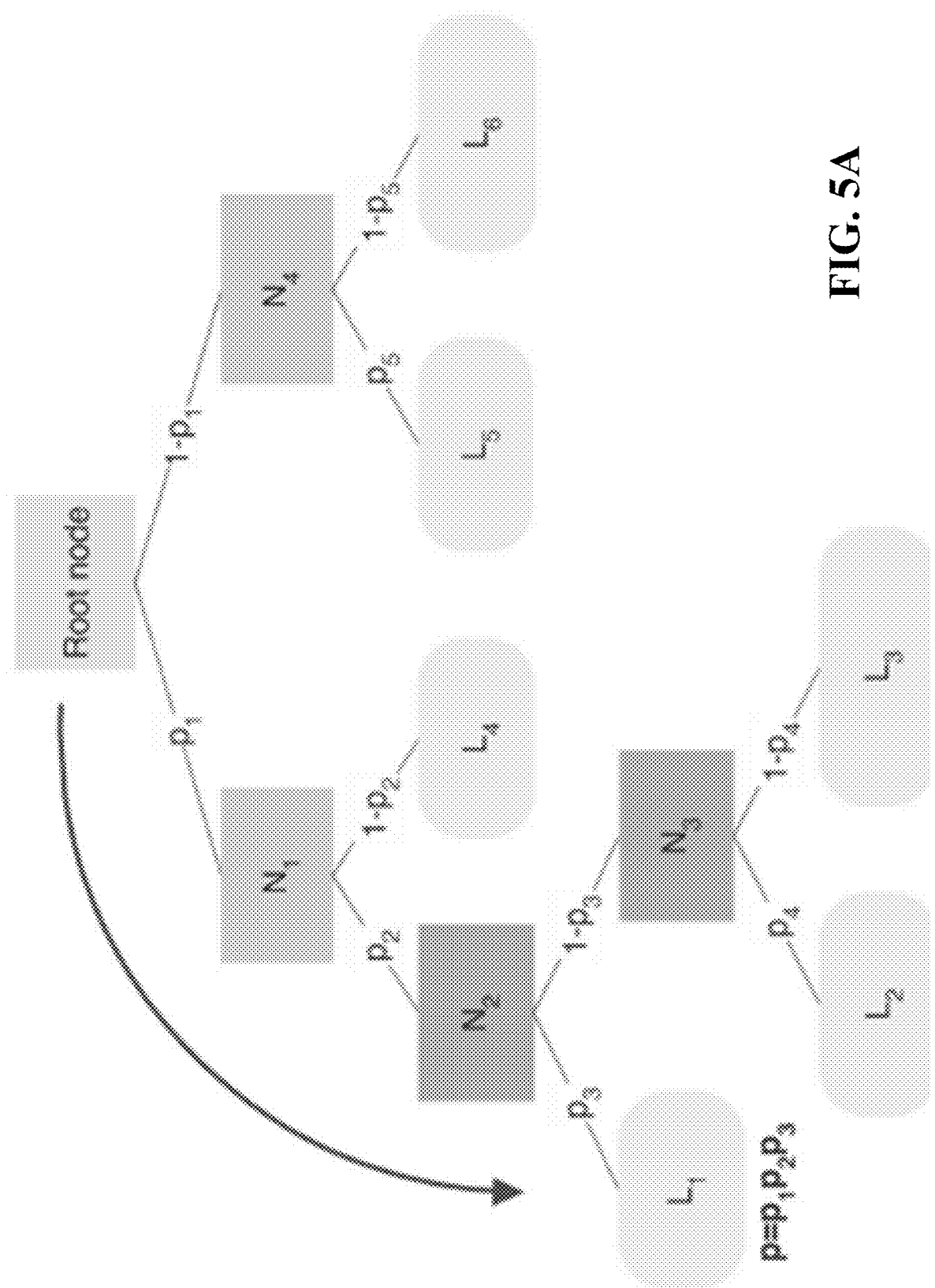
FIG. 5A depicts a soft decision tree (SDT) whose depth is 4.
Figure 5B:
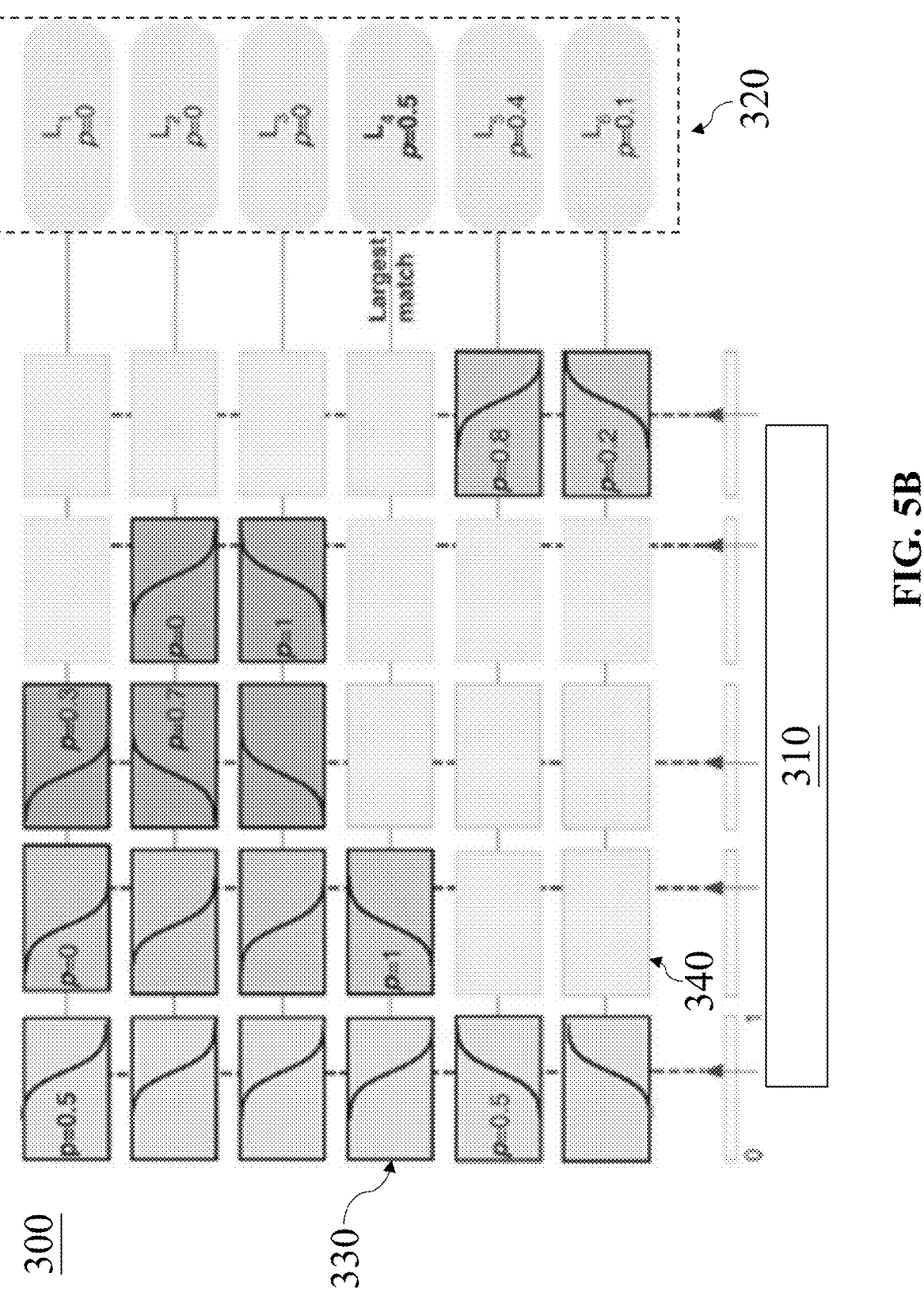
FIG. 5B depicts a mapping result of the SDT in FIG. 5A into an ACAM array according to one embodiment of the present invention.

FIG. 5A and FIG. 5B present an example of mapping an SDT with a depth of 4 into analog CAM. Specifically, FIG. 5A depicts a SDT whose depth is 4, and FIG. 5B depicts a mapping result of the SDT in FIG. 5A into an ACAM array 300 according to one embodiment of the present invention.

The illustration of FIG. 5A shows the SDT structure with a root node and deeper inner nodes for calculating probability p or (1–p). The final probability of each leaf node is the product of all the node probabilities along the path from the root node to each leaf node. The final output is from the leaf with the highest probability.

The illustration of FIG. 5B shows the mapping of the SDT in analog CAM. An ACAM array 300 for mapping a well-trained SDT into an analog CAM configuration includes an input controller 310, an output receiver 320, and a plurality of ACAM cells 330 as afore-mentioned. The ACAM cells 330 are electrically coupled between the input controller 310 and the output receiver 320 and are arranged as multiple rows and multiple columns for forming an array.

According to the configuration as afore-described, the ACAM cells 330 in the same row share a voltage from the same match line (e.g., ML voltage). Furthermore, first search lines and second search lines used in the array for the ACAM cells 330 are electrically connected to the input controller 310. In one embodiment, the input controller 310 is configured to feed an input signal (e.g., SL voltage) to each of the ACAM cells 330 in the same column via a voltage interval, such as 0 to 1 voltage. The match lines used in the array for the ACAM cells 330 are electrically connected to the output receiver 320. As such, the ACAM cells 330 are configured to map signals from the input controller 310 and output match-line voltages to the output receiver 320 in response to a mapping result during the dynamic process. In one embodiment, the output receiver 320 includes a WTA (Winner-Takes-All) circuit to compare match-line voltages (ML voltages) of different rows according to the match lines, so as to find the largest one among them to determine a final output. The output receiver 320 is further configured to process the final output as a probability signal to be output from the ACAM array 300.

More specifically, firstly, the input is transformed to a voltage interval, e.g., from 0 to 1V using the input controller 310. Then, the ratio of gain $k_i$ over initial $k_0$ (the ratio is very close to 1) is multiplied to the corresponding input for different columns as an additional tuning parameter. Thereafter, the threshold of each ACAM cell 330 in the ACAM array 300 is programmed to be the parameter $c_{ij}$ for the $i_{th}$ node in the $j_{th}$ path leading towards the $j_{th}$ leaf node.

In one embodiment, the ACAM array 330 further includes at least one blank cell 340 arranged adjacent to at least one of the ACAM cells 330 for responding with a probability of 1. Accordingly, it should be noted that not every path contains the $i_{th}$ node, and there are many blank cells without mapping thresholds for them, and these cells always respond with a probability of 1. The blank cells behave like sparse regularization during training and can be reorganized to save memory storage for inference. In some embodiment, the blank cell 340 is adjacent to at least one of the ACAM cells 330 in the same row. In some embodiment, the blank cell 340 is adjacent to at least one of the ACAM cells 330 in the same column.

Although the ACAM array 300 is a 4*4 array, however, embodiments of the present invention are not limited by the illustration. In various embodiments, an ACAM array is a N*N array, where N is a positive integer greater than 1.

A conventional method is to reorder the nodes within more paths as some features are more important and occur more often than others. Some conditions in different nodes of a decision path that use the same feature can also be merged into a matching range and mapped into fewer ACAM cells. However, these methods are not used in mapping in the solution provided by the present invention to make a more strict comparison with standard trees and other hardware methods.

After mapping the SDT into the ACAM array, the inference can be implemented by adding input voltages on the corresponding columns of the array. As a result, the precharged voltage on the match line of each row goes down at different rates. The output of the SDT should be products of the probability in the algorithm represented by the ML voltage in rows. However, there may be differences in hardware.

Figure 6B:
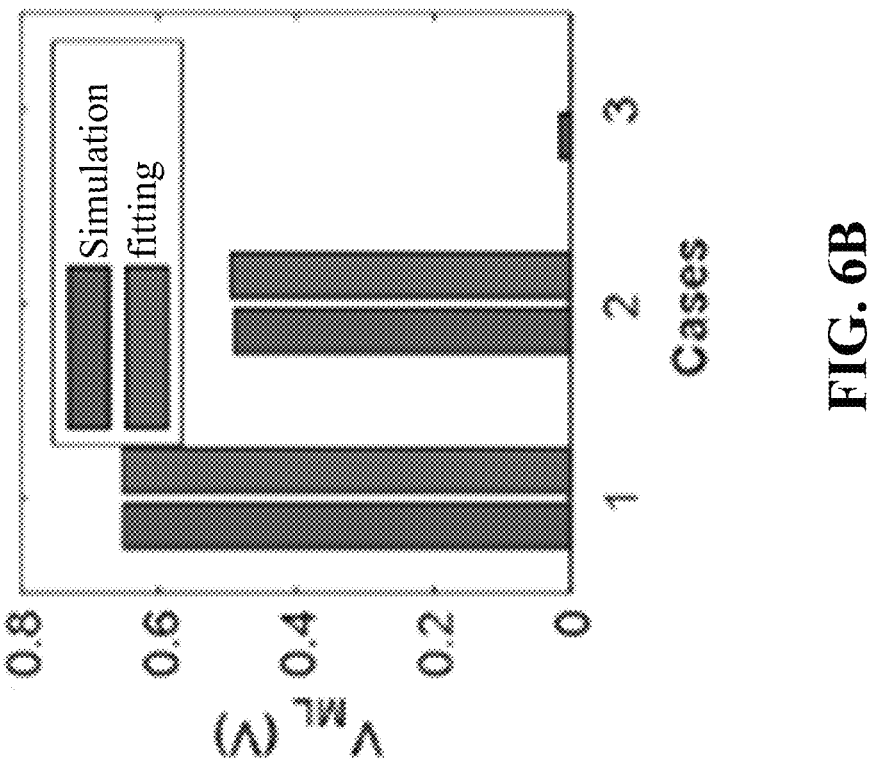
FIG. 6B depicts a match-line voltage of a 1×8 row configuration in an ACAM array that cells are with random matching degrees according to one embodiment of the present invention.
Figure 6A:
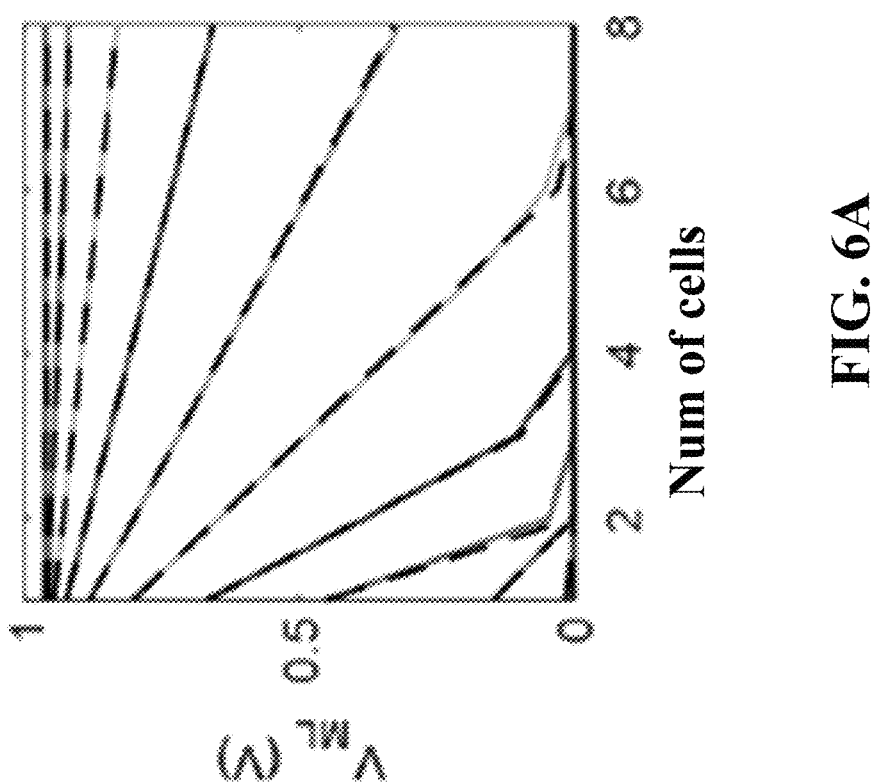
FIG. 6A depicts a match-line voltage of a 1×8 row configuration in an ACAM array that cells are with the same matching degree according to one embodiment of the pres-ent invention.

FIG. 6A depicts a match-line voltage of a 1×8 row configuration in an ACAM array that cells are with the same matching degree according to one embodiment of the present invention. The cells have the same matching degree, meaning their output probabilities are the same. Different lines represent different matching degrees, which vary from 0 to 1. The solid lines represent the simulation results, and the dashed lines represent the fitting results. With the increasing number of cells with the same matching degree (others are always outputting 1 and can be omitted), the ML voltage goes down approximately in proportion to the products of probabilities. The curves are fitted by the following equation:

$$V_{fit} = \min(\max(ap^n + (1-a)(1-n(1-p)) + b(n-1), 0), 1) \qquad \text{(Eq. 7)}$$

where a and b are parameters for fitting. The equation contains three parts: the product part of $p^n$ representing the $e^{V_g - V_{th}}$ in Eq. 3, the subtraction part with reference to $(V_g - V_{th})^2$ and $(V_g - V_{th})$ in Eq. 4 and 5, and a compensation part containing n as the increasing number of cells. The maximum and minimum functions are added to ensure that the fitting value's upper bound and lower bound are 1 and 0, respectively. They are all fitted well, especially for higher values, which are more likely to be the largest one as output. Since the fitting equation is based on the assumption that all cells are at the same matching degree, FIG. 6B depicts a match-line voltage of a 1×8 row configuration in an ACAM array that cells are with random matching degrees according to one embodiment of the present invention, showing a comparison between spice model simulation (left bars) and equation fitting results (right bars). All comparison results of the ML voltages in three cases are very close. Therefore, the fitting results can be used to represent the ML voltages in the ACAM array. Finally, a circuit of WTA is used to compare the ML voltages of different rows, and the largest one is the final output. Another way is to use a crossbar to accumulate the probabilities for each class, which is much faster and can also be more accurate. It is also the implementation approach of random forests.

Robustness Against Attacks and Noise:

The robustness of the proposed SDT of the present invention and standard decision tree (DT) is evaluated on the MNIST dataset, which is a handwritten digit recognition task. This is not a task that tree-based models are typically good at, but it can still prove the robustness of the proposed SDT of the present invention in a more general way. Every result of the robustness evaluation is an average value of 10 times repetition, considering the randomness. The accuracy of DT and SDT with increasing tree depth is compared in FIG. 7.

Figure 7:
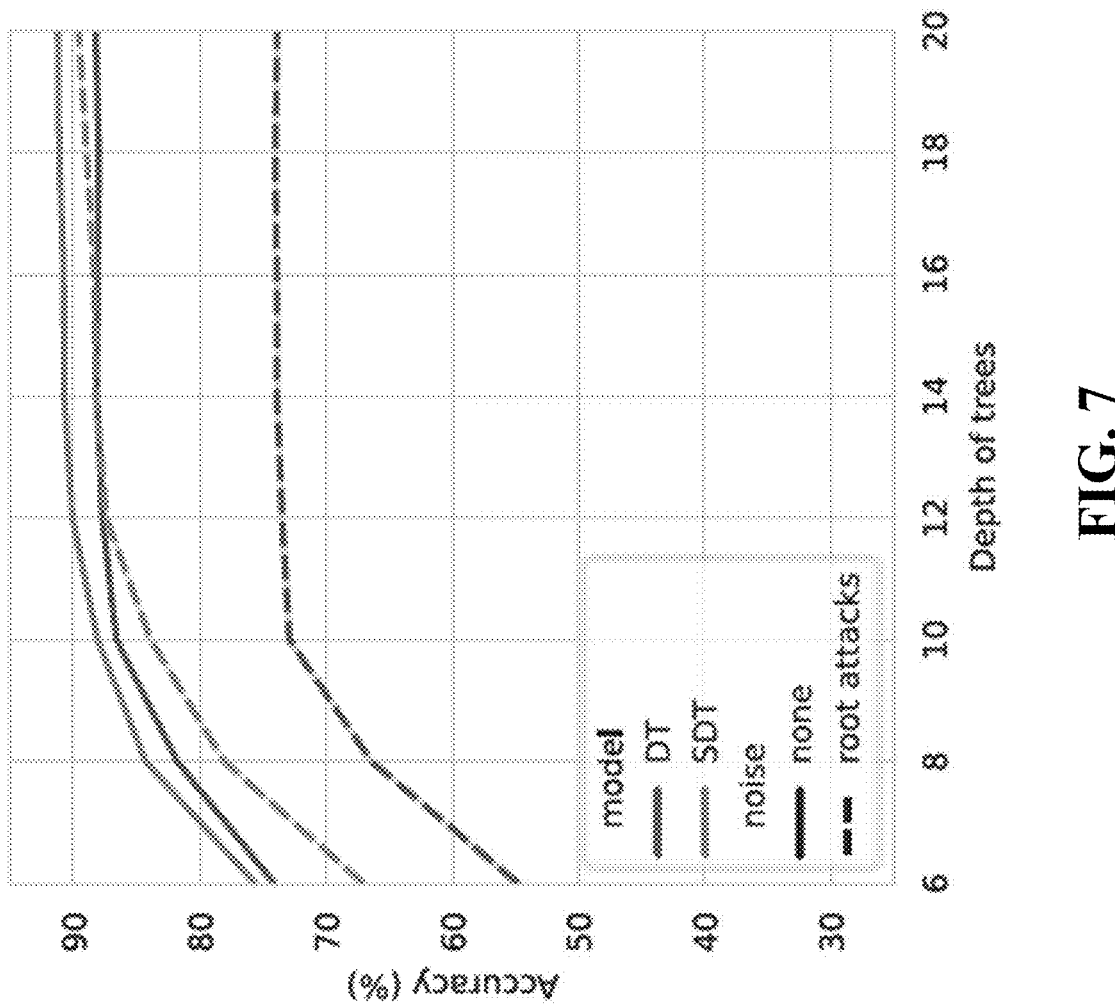
FIG. 7 depicts an accuracy graph on MNIST of standard decision tree (DT) and SDT under random adversarial attacks on root according to one embodiment of the present invention.

FIG. 7 depicts an accuracy graph on MNIST of standard decision tree (DT) and SDT under random adversarial attacks on root according to one embodiment of the present invention. Obviously, SDT, represented by the upper solid line, always performs better than DT, which is the lower solid line with the same depth. The best accuracy of DT is 88.25% with a depth of 16, and that of SDT is 91.28% with a depth of 18. Considering root nodes are the weakest points in tree models, an adversarial attack is applied, which is a uniform distribution from 0 to 1V, to the root nodes of DT and SDT. It means that one pixel of the input image is replaced by a random noise at the same order of magnitude. Then, it is found that DT models are quite weak to the attack and are heavily affected. The accuracy, which is the lower dashed line, can hardly be over 75%. In contrast, SDT models perform with much more stable accuracy (which is the upper dashed line) due to soft boundaries. Under the root node adversarial attack, SDT models can even perform with higher accuracy than unattacked DT models when the depth is over 16. It is also found that the robustness of SDT models against adversarial attack gradually increases with the depth of the tree. The SDT model with a depth of 20 performs the best under attack, and the decrease of accuracy due to the attack is only 1.7%. Since emerging devices often suffer from drifting noise on their storage parameters, a study is conducted to compare the robustness of DT and SDT against random drifting noise on inner nodes which can affect the decision thresholds to some extent. The noise is an even less variation which is a uniform distribution from −0.1V to 0.1V.

Figure 8:
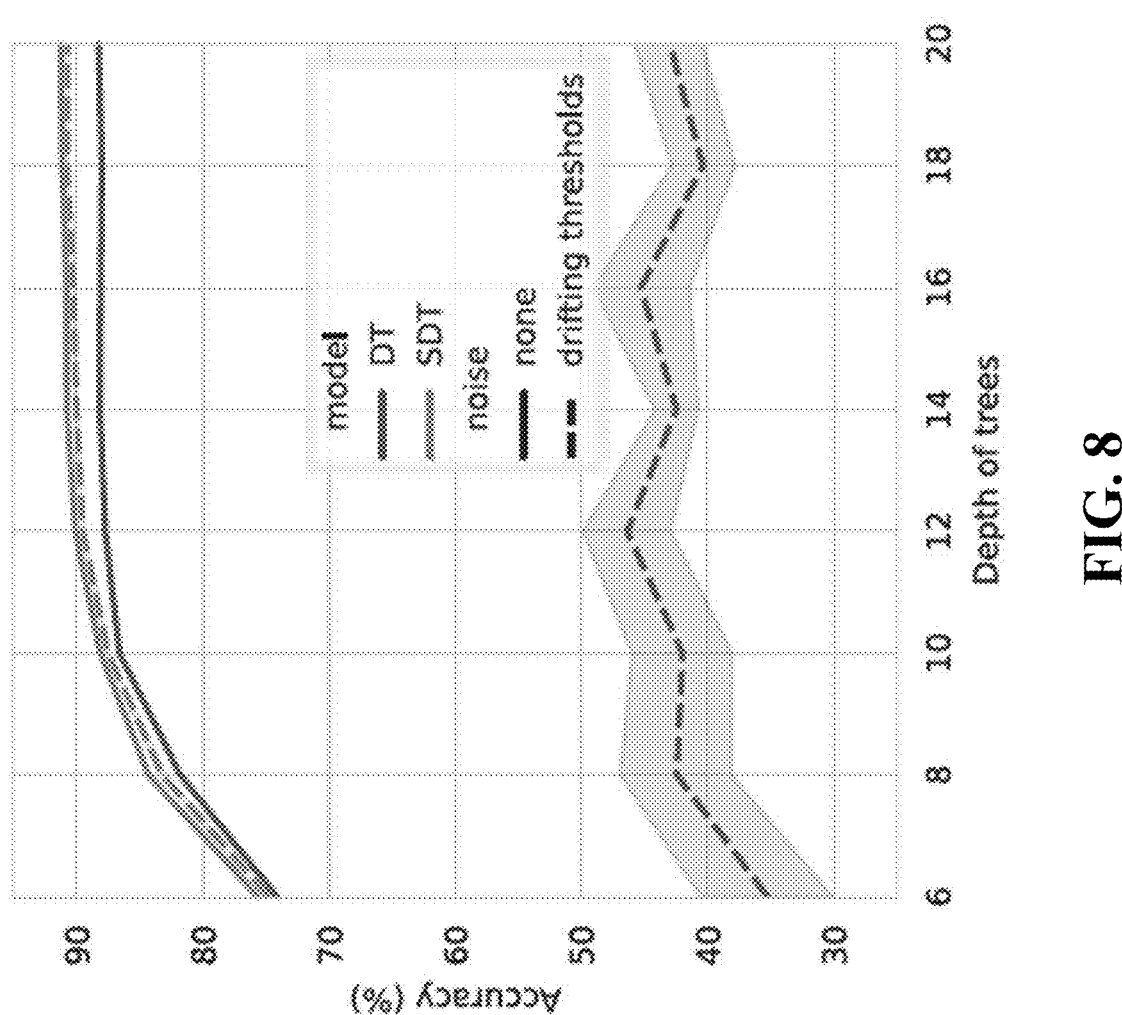
FIG. 8 depicts an accuracy graph on MNIST of standard DT and SDT with random drifting noise on inner node thresholds root according to one embodiment of the present invention.

FIG. 8 depicts an accuracy graph on MNIST of standard DT and SDT with random drifting noise on inner node thresholds root according to one embodiment of the present invention. Results, as shown in FIG. 8, indicate that DT models are extremely sensitive to minor drifting noise. All models with different depths collapse and the accuracy is less than 50%. On the other hand, SDT models exhibit surprising steadiness against the drifting threshold noise due to their soft boundaries, and the accuracy is almost unaffected (only 0.6%).

Figure 9:
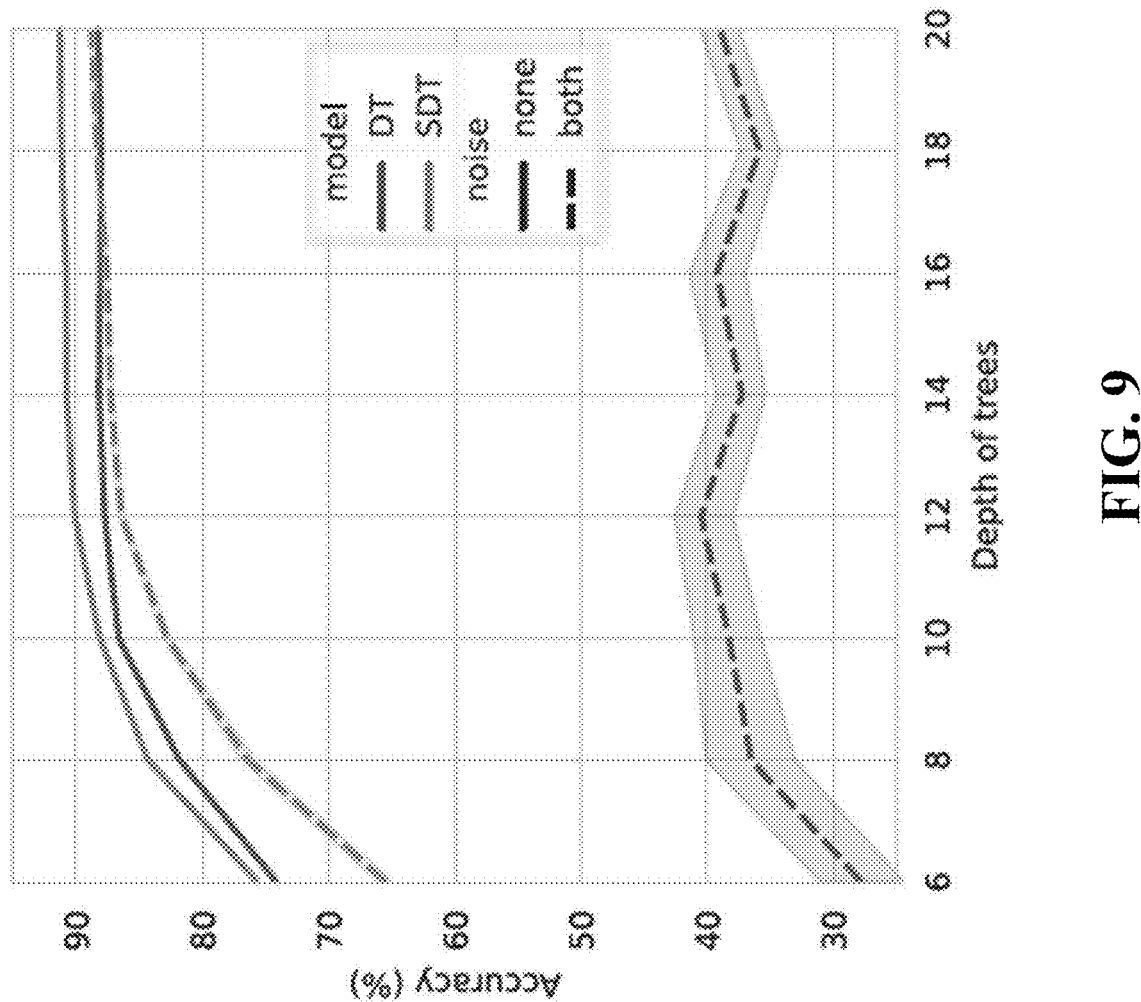
FIG. 9 depicts an accuracy graph on MNIST of standard DT and SDT with both attacks on root nodes and drifting noise on inner node thresholds according to one embodiment of the present invention.

FIG. 9 depicts an accuracy graph on MNIST of standard DT and SDT with both attacks on root nodes and drifting noise on inner node thresholds according to one embodiment of the present invention. The illustration of FIG. 9 shows a similar trend of DT and SDT under the combination of adversarial attacks and drifting noise. SDT models exhibit high robustness, while DT models perform even worse with the accuracy around 40%.

In addition to evaluating model robustness, a benchmark of latency and energy consumption is conducted for SDT implemented on different hardware. The latency, power, and energy consumption data were mostly obtained from some related works, as design of the present disclosure did not have any extra hardware overhead except for a possible circuit of WTA. The DT and SDT models had a depth of 20, and the input batch for inference was 10,000. For latency, the average inference time repeated 10 times is calculated for each sample of DT and SDT implemented on CPU and GPU.

Figures 10, 11:
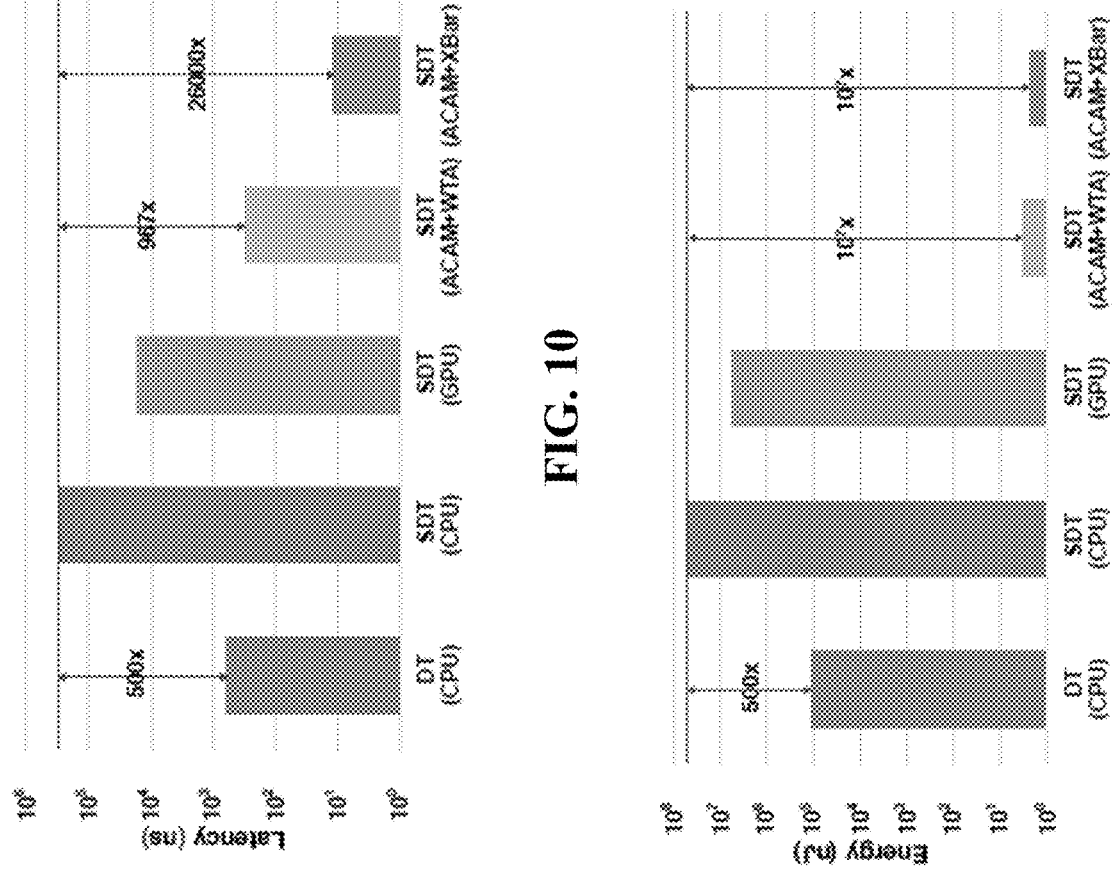
FIG. 10 depicts a latency benchmark graph of standard DT and SDT implemented in different hardware for each sample according to one embodiment of the present inven-tion.
FIG. 11 depicts an energy benchmark graph of standard DT and SDT implemented in different hardware for each sample according to one embodiment of the present inven-tion.

FIG. 10 depicts a latency benchmark graph of standard DT and SDT implemented in different hardware for each sample according to one embodiment of the present invention. As it is known from previous analysis, the SDT takes extremely computational overhead in conventional von Neumann hardware like CPU. The benchmark presents a quantitative result that the latency for SDT is 500 times greater than the latency of DT with the same tree structure. Thus, it is quite inefficient for the inference of a large SDT model compared with DT. Even with GPU, the latency of SDT is dozens of times greater than that of DT. However, SDT implemented in ACAM can be almost 1000 times faster than in CPU, as the WTA circuit can take several hundred nanoseconds to output the result with the highest probability (voltage). It can be further accelerated to about 26,000 times faster than in CPU with an additional crossbar combined with ACAM to accumulate the probabilities for the classes for output.

FIG. 11 depicts an energy benchmark graph of standard DT and SDT implemented in different hardware for each sample according to one embodiment of the present invention. Energy consumption illustrated by FIG. 11 can be the inference latency multiplied with the hardware power. The used CPU and GPU are AMD EPYC 7413 and RTX 3090 24G with power of 180 W and 350 W, respectively. The power of WTA or crossbar is extremely low. So, the benchmark of energy shows an even greater ratio that the energy consumption of each sample for SDT implemented in ACAM is 7 and 6 orders of magnitude lower than that in CPU and GPU, respectively.

As discussed above, in the present disclosure, an algorithm-hardware co-design approach to soften decision trees into an ACAM through knowledge distilling is provided. By leveraging the intrinsic soft matching boundaries in ACAM, the SDT model can be naturally implemented in an efficient way. Benefiting from the implementation in ACAM, the SDT with heavy computational overhead can be accelerated from 1000× to over 26000×, and the energy consumption is reduced by 7 orders of magnitude. Compared with standard decision tree models, SDT models of different depths show better interpretability, higher accuracy, and, more importantly, much better robustness than standard decision trees against adversarial attacks on root nodes and/or drifting noise on thresholds. Therefore, due to the soft boundaries, the proposed design of SDT is hardware-friendly for emerging analog CAM devices and trustworthy, as it can mitigate the instability and sensitivity of standard tree-based models.

Figure 12:
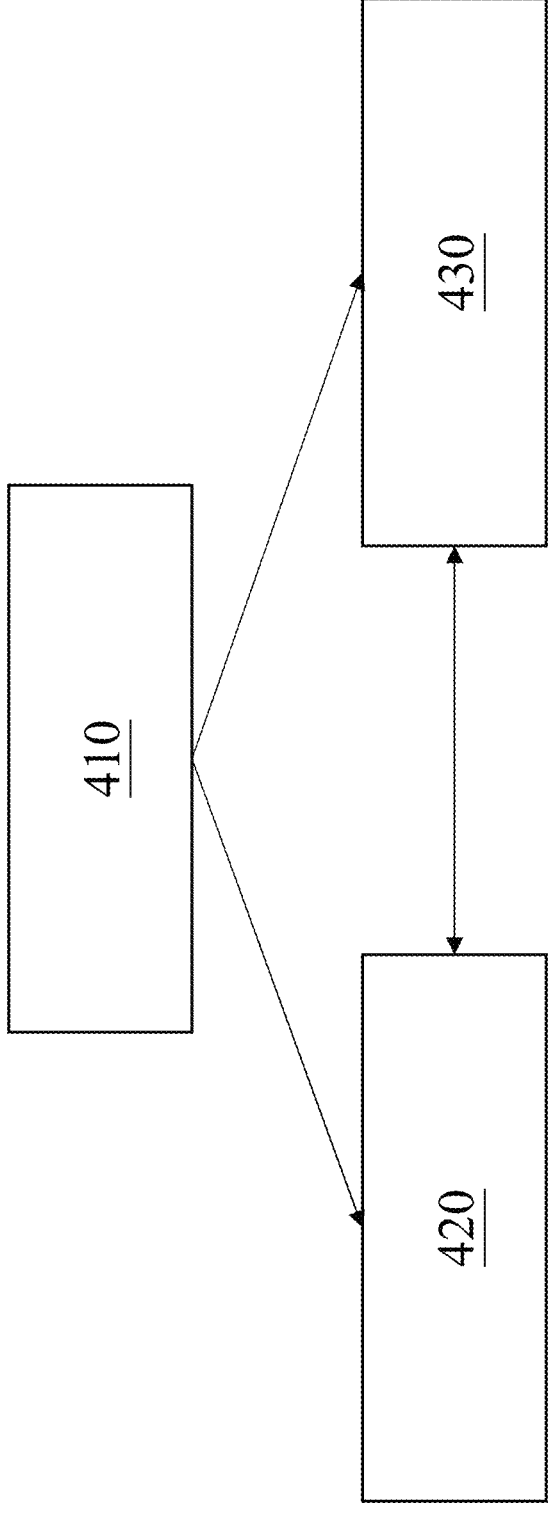
FIG. 12 depicts a schematic drawing for a SDT computation system using the mapping configuration according to one embodiment of the present invention.

FIG. 12 depicts a schematic drawing for a SDT computation system 400 using the above mapping configuration according to one embodiment of the present invention. According to the above descriptions, in one embodiment, a SDT computation system using that mapping configuration is provided. The SDT computation system 400 includes a SDT module 410, an ACAM array 420, a mapping module 430.

The SDT module 410 is for outputting a final probability and is configured to provide a SDT structure with a root node and deeper inner nodes for calculating probability, such as the structure shown in FIG. 5A. Accordingly, by the SDT module 410, the final probability of each leaf node of the SDT structure is a product of all of node probabilities along a path from the root node to each leaf node, in which a final output of the SDT module is from a leaf with the highest probability. For example, if the leaf node L4 in the SDT structure of FIG. 5A is the highest probability, the event related to the leaf node L4 is determined to be output by the SDT computation system 400. In some embodiments, the SDT module 410 is stored in a memory and processed by a processor.

The output of the SDT module 410 is associated with a real-world event/application for classifying features, such as applications in machine learning. The SDT module 410 provides decision trees for various applications, including but not limited to: (1) Medical Diagnosis: classifying patient data to diagnose diseases based on symptoms and medical history; (2) Customer Segmentation: grouping customers based on purchasing behavior, demographics, and other factors for targeted marketing strategies; (3) Spam Detection: filtering out spam emails by classifying emails based on content, sender information, and other attributes; and (4) Credit Scoring: assessing the creditworthiness of individuals by evaluating financial history, income, and other relevant factors; (5) Sentiment Analysis: analyzing text data from social media, reviews, or surveys to determine the sentiment expressed (positive, negative, neutral); (6) Autonomous driving: making decisions to determine appropriate actions based on sensor data and environmental factors in autonomous driving systems (stopping, turning, or accelerating).

The ACAM array 420 refers to the configuration as afore-described and is electrically coupled with the SDT module 410. The mapping module 430 is electrically coupled with the SDT module 410 and the ACAM array 420. The mapping module 430 is configured to map of the SDT structure provided by the SDT module 410 into the ACAM array 420, such that each of the ACAM cells in the ACAM array 420 has a threshold programmed to be a parameter for a node in a path leading towards the leaf node of the SDT structure. In one embodiment, I-V characteristics of the ACAM cells in the ACAM array 420 within an interval of the search-line voltage during the dynamic process are captured for mapping a well-trained SDT by the mapping module 430, resulting in a smooth and effective transfer of the SDT structure into the ACAM array 420 and facilitating robust and interpretable decision-making capabilities.

For example, the SDT structure of the SDT module 410 is set for applying to a decision-making process in autonomous driving. In this case, in the SDT structure, the root node and each inner node correspond to initial processing of sensor data and environmental factors, and the leaf nodes represent potential actions containing stopping, turning, and accelerating. The decision-making process in the autonomous driving in the SDT structure can be mapped to the ACAM array 420 by the mapping module 430, thereby accurately and reliably determining an appropriate action for the autonomous driving. In one embodiment, the output final-signal of the ACAM array 420 represent the most potential action for the autonomous driving, such as containing stopping, turning, and accelerating. This final signal can be interpreted or parsed and then input into a programing module to physically execute the action, causing the vehicle to stop, turn, or accelerate.

The functional units and modules of the apparatuses and methods in accordance with the embodiments disclosed herein may be implemented using computing devices, computer processors, or electronic circuitries including but not limited to application specific integrated circuits (ASIC), field programmable gate arrays (FPGA), microcontrollers, and other programmable logic devices configured or programmed according to the teachings of the present disclosure. Computer instructions or software codes running in the computing devices, computer processors, or programmable logic devices can readily be prepared by practitioners skilled in the software or electronic art based on the teachings of the present disclosure.

All or portions of the methods in accordance to the embodiments may be executed in one or more computing devices including server computers, personal computers, laptop computers, mobile computing devices such as smartphones and tablet computers.

The embodiments may include computer storage media, transient and non-transient memory devices having computer instructions or software codes stored therein, which can be used to program or configure the computing devices, computer processors, or electronic circuitries to perform any of the processes of the present invention. The storage media, transient and non-transient memory devices can include, but are not limited to, floppy disks, optical discs, Blu-ray Disc, DVD, CD-ROMs, and magneto-optical disks, ROMs, RAMs, flash memory devices, or any type of media or devices suitable for storing instructions, codes, and/or data.

Each of the functional units and modules in accordance with various embodiments also may be implemented in distributed computing environments and/or Cloud computing environments, wherein the whole or portions of machine instructions are executed in distributed fashion by one or more processing devices interconnected by a communication network, such as an intranet, Wide Area Network (WAN), Local Area Network (LAN), the Internet, and other forms of data transmission medium.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

What is claimed is:

1. An analog content addressable memory (ACAM) cell for mapping a well-trained SDT into an analog CAM configuration, comprising:
   a first floating-gate transistor (FG-FET) and a second FG-FET;
   a match line electrically coupled to drains of the first and second FG-FETs;
   a source coupled line electrically coupled to sources of the first and second FG-FETs;
   a first search line electrically coupled to a gate of the first FG-FET; and
   a second search line electrically coupled to a gate of the second FG-FET, the first and second FG-FETs are collectively configured to serve for a dynamic process which is started with pre-charging the match line to a high-level voltage and then applying a voltage to the first search line or the second search line to increase electrical potential of the corresponding gate of the first FG-FET or the second FG-FET, such that the match line discharges to the source coupled line, resulting in a reduction in a match-line voltage, permitting the match-line voltage to decrease for approaching to zero within a matching range of a search-line voltage;

wherein the ACAM cell is configured to operate to provide the match-line voltage without conversion by a sense amplifier into a binary match/mismatch signal.

2. The ACAM cell of claim 1, wherein, when the voltage applied to the first search line is smaller than a threshold voltage of the first FG-FET, the first FG-FET works at a subthreshold region, and a drain current of the first FG-FET is described as:

$$I_{d,sub} = I_0 e^{\frac{q(V_g - V_{th})}{nKT}} \left(1 - e^{-\frac{qV_d}{KT}}\right),$$

where $V_g$ is a gate voltage of the first FG-FET, $V_d$ is a drain voltage of the first FG-FET, $V_{th}$ is the threshold voltage of the first FG-FET, and $I_0$, q, n, K and T are all constants.

3. The ACAM cell of claim 2, wherein, when the voltage applied to the first search line is higher than the threshold voltage of the first FG-FET, the first FG-FET initially operates in the saturation region, and the drain current of the first FG-FET is described as:

$$I_{d,sat} = \frac{KP}{2} \frac{W}{L} (1 + \lambda V_d)(V_g - V_{th})^2,$$

where KP, $\lambda$, $$\frac{W}{L}$$

are constants associated with the processing dynamic process of the first FG-FET.

4. The ACAM cell of claim 3, wherein the first FG-FET then switches to a linear region as the drain voltage $V_d$ of the first FG-FET decreases, and the drain current of the first FG-FET is described as:

$$I_{d,lin} = KP\frac{W}{L}(1 + \lambda V_d)\left(V_g - V_{th} - \frac{V_d}{2}\right)V_d. \qquad \text{(Eq. 5)}$$

5. The ACAM cell of claim 1, wherein each of the first FG-FET and the second FG-FET has a threshold voltage in a range from 0.56 V to 1.59 V.

6. An analog content addressable memory (ACAM) array for mapping a well-trained SDT into an analog CAM configuration, comprising:
an input controller;
an output receiver; and
a plurality of ACAM cells of claim 1 electrically coupled between the input controller and the output receiver and arranged as multiple rows and multiple columns, wherein the ACAM cells in the same row share a voltage from the same match line, and wherein the first search lines and the second search lines are electrically connected to the input controller, and the match lines are electrically connected to the output receiver, such that the ACAM cells are configured to map signals from the input controller and output match-line voltages to the output receiver in response to a mapping result during the dynamic process.

7. The ACAM array of claim 6, wherein the input controller is configured to feed an input signal to each of the ACAM cells in the same column via a voltage interval.

8. The ACAM array of claim 7, wherein the output receiver comprises a WTA (Winner-Takes-All) circuit to compare match-line voltages of different rows according to the match lines, so as to find the largest one among them to determine a final output.

9. The ACAM array of claim 8, wherein the output receiver is further configured to process the final output as a probability signal to be output from the ACAM array, and the ACAM array further comprises at least one blank cell arranged adjacent to at least one of the ACAM cells, wherein the blank cell is without mapping thresholds and is configured to respond with a probability of 1.

10. The ACAM array of claim 9, wherein the blank cell is adjacent to at least one of the ACAM cells in the same row.

11. The ACAM array of claim 9, wherein the blank cell is adjacent to at least one of the ACAM cells in the same column.

12. The ACAM array of claim 6, wherein the ACAM array is a N*N array, where N is a positive integer greater than 1.

13. The ACAM array of claim 6, wherein the match-line voltages generated by the ACAM cells are supplied to the output receiver without an intermediate sense amplification stage converting match-line voltages to digital match indicators.

14. A soft decision tree (SDT) computation system, comprising:
a SDT module for outputting a final probability and configured to provide a SDT structure with a root node and deeper inner nodes for calculating probability, wherein the final probability of each leaf node of the SDT structure is a product of all of node probabilities along a path from the root node to each leaf node, and wherein a final output of the SDT module is from a leaf with the highest probability;
an analog content addressable memory (ACAM) array of claim 6;
a mapping module configured to map the SDT structure into the ACAM array, such that each of the ACAM cells in the ACAM array has a threshold programmed to be a parameter for a node in a path leading towards the leaf node of the SDT structure.

15. The SDT computation system of claim 14, wherein I-V characteristics of the ACAM cells in the ACAM array within an interval of the search-line voltage during the dynamic process are captured for mapping a well-trained SDT by the mapping module.

16. The SDT computation system of claim 14, wherein threshold voltages of two FG-FETs in each of the ACAM cells in the ACAM array are adjusted between high and low matching bounds, so as to act as an inner node in the SDT structure.

17. The SDT computation system of claim 14, wherein the ACAM array further comprises at least one blank cell arranged adjacent to at least one of the ACAM cells, which is without mapping thresholds and is configured to respond with a probability of 1.

18. The SDT computation system of claim 14, wherein the SDT structure is applied to a decision-making process in autonomous driving, the root node and inner nodes correspond to initial processing of sensor data and environmental factors, and the leaf nodes represent potential actions containing stopping, turning, and accelerating, and wherein the decision-making process in the autonomous driving is mapped to the ACAM array by the mapping module to accurately and reliably determine an appropriate action for the autonomous driving.

19. The SDT computation system of claim 14, wherein the match-line voltages generated by the ACAM array are processed as continuously varying analog responses corresponding to soft decision boundaries of the deeper inner nodes of the SDT structure to determine the final output.

* * * * *